(12) United States Patent
Campbell et al.

(10) Patent No.: US 7,511,957 B2
(45) Date of Patent: Mar. 31, 2009

(54) METHODS FOR FABRICATING A COOLED ELECTRONIC MODULE EMPLOYING A THERMALLY CONDUCTIVE RETURN MANIFOLD STRUCTURE SEALED TO THE PERIPHERY OF A SURFACE TO BE COOLED

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 11/420,241

(22) Filed: May 25, 2006

(65) Prior Publication Data
US 2007/0274045 A1     Nov. 29, 2007

(51) Int. Cl.
*H05K 7/20* (2006.01)

(52) U.S. Cl. .................. 361/699; 361/700; 165/80.3; 165/908; 257/714

(58) Field of Classification Search ............ 361/687, 361/689, 699; 165/80.4, 168, 908; 257/E23.098, 257/E23.1, 714; 62/259.2
See application file for complete search history.

(56) References Cited

U.S. PATENT DOCUMENTS

| | | | | |
|---|---|---|---|---|
| 5,023,695 A | * | 6/1991 | Umezawa et al. | 257/714 |
| 5,270,572 A | | 12/1993 | Nakajima et al. | 257/714 |
| 5,412,536 A | | 5/1995 | Anderson et al. | 361/700 |

(Continued)

FOREIGN PATENT DOCUMENTS

JP          4367253          12/1992

OTHER PUBLICATIONS

"Fluid Cooling Systems and Methods for Electronic Components," Pompeo et al., U.S. Appl. No. 10/904,555, filed Nov. 16, 2004.

(Continued)

*Primary Examiner*—Jayprakash Gandhi
*Assistant Examiner*—Courtney L Smith
(74) *Attorney, Agent, or Firm*—Lily Neff, Esq.; Kevin P. Radigan, Esq.; Reslin Rothenberg Farley & Mesiti P.C.

(57) ABSTRACT

A cooled electronic module and method of fabrication are provided employing a cooling apparatus for removing heat from one or more electronic devices disposed on a substrate. The cooling apparatus includes a supply manifold structure having a plurality of inlet orifices for injecting coolant onto a surface to be cooled, and a return manifold structure. The return manifold structure, which is fabricated of a thermally conductive material, has a base surface sealed to the surface to be cooled along a periphery thereof employing a thermally conductive, coolant-tight seal. The return manifold structure provides at least one return passageway for exhausting coolant after impinging on the surface to be cooled, wherein coolant exhausting through the at least one passageway cools the return manifold structure, thereby facilitating further cooling of the surface to be cooled in a region where the base surface is sealed to the surface to be cooled.

2 Claims, 3 Drawing Sheets

U.S. PATENT DOCUMENTS

| | | | | |
|---|---|---|---|---|
| 5,436,501 | A * | 7/1995 | Ikeda | 257/714 |
| 5,959,351 | A * | 9/1999 | Sasaki et al. | 257/714 |
| 6,108,201 | A | 8/2000 | Tilton et al. | 361/689 |
| 6,498,725 | B2 | 12/2002 | Cole et al. | 361/700 |
| 6,550,263 | B2 * | 4/2003 | Patel et al. | 62/259.2 |
| 6,771,500 | B1 | 8/2004 | Siegel et al. | 261/699 |
| 6,940,712 | B2 | 9/2005 | Chu et al. | 361/679 |
| 7,092,254 | B1 * | 8/2006 | Monsef et al. | 361/699 |
| 7,206,203 | B2 * | 4/2007 | Campbell et al. | 361/699 |
| 7,233,494 | B2 * | 6/2007 | Campbell et al. | 361/699 |
| 2002/0163782 | A1 | 11/2002 | Cole et al. | 361/700 |
| 2002/0185260 | A1 * | 12/2002 | Calaman et al. | 165/80.4 |
| 2005/0185378 | A1 * | 8/2005 | Tilton et al. | 361/699 |
| 2006/0071326 | A1 * | 4/2006 | Chrysler et al. | 257/714 |
| 2006/0104031 | A1 * | 5/2006 | Colgan et al. | 361/699 |
| 2006/0117765 | A1 * | 6/2006 | Bash et al. | 62/121 |
| 2006/0250774 | A1 * | 11/2006 | Campbell et al. | 361/699 |
| 2007/0121299 | A1 * | 5/2007 | Campbell et al. | 361/710 |
| 2007/0159797 | A1 * | 7/2007 | Teneketges et al. | 361/699 |
| 2007/0163750 | A1 * | 7/2007 | Bhatti et al. | 165/80.4 |
| 2007/0188991 | A1 * | 8/2007 | Wilson et al. | 361/699 |

OTHER PUBLICATIONS

"Cooling Apparatus, Cooled Electronic Module and Methods of Fabrication Thereof Employing an Integrated Coolant Inlet and Outlet Manifold," Campbell et al., U.S. Appl. No. 11/124,513, filed May 6, 2005.

"Cooling Apparatus, Cooled Electronic Module and Methods of Fabrication Thereof Employing An Integrated Manifold and a Plurality of Thermally Conductive Fins," Campbell et al., U.S. Appl. No. 11/124,064, filed May 6, 2005.

* cited by examiner

METHODS FOR FABRICATING A COOLED ELECTRONIC MODULE EMPLOYING A THERMALLY CONDUCTIVE RETURN MANIFOLD STRUCTURE SEALED TO THE PERIPHERY OF A SURFACE TO BE COOLED

CROSS REFERENCE TO RELATED APPLICATIONS

This application contains subject matter which is related to the subject matter of the following applications, each of which is assigned to the same assignee as this application and each of which is hereby incorporated herein by reference in its entirety:

"Electronic Device Substrate Assembly With Multilayer Impermeable Barrier and Method of Making", Chu et al., U.S. Pat. No. 6,940,712, issued Sep. 6, 2005;

"Fluidic Cooling Systems and Methods for Electronic Components," Pompeo et al., Ser. No. 10/904,555; filed Nov. 16, 2004;

"Cooling Apparatus, Cooled Electronic Module and Methods of Fabrication Thereof Employing an Integrated Coolant Inlet and Outlet Manifold," Campbell et al., Ser. No. 11/124,513, filed May 6, 2005; and "Cooling Apparatus, Cooled Electronic Module and Methods of Fabrication Thereof Employing An Integrated Manifold And A Plurality of Thermally Conductive Fins," Campbell et al., Ser. No. 11/124,064, filed May 6, 2005.

TECHNICAL FIELD

The present invention relates to heat transfer mechanisms, and more particularly, methods for fabricating cooled electronic modules for removing heat generated by one or more electronic devices. Still more particularly, the present invention relates to methods for cooling one or more electronic devices.

BACKGROUND OF THE INVENTION

As is known, operating electronic devices produce heat. This heat should be removed from the devices in order to maintain device junction temperatures within desirable limits, with failure to remove the heat thus produced resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/$cm^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

Thus, the need to cool current and future high heat load, high heat flux electronic devices, mandates the development of aggressive thermal management techniques, such as liquid jet impingement, to cool the electronic devices. The invention disclosed herein is addressed to this continuing need for enhanced liquid based cooling apparatuses and methods of cooling.

SUMMARY OF THE INVENTION

The shortcomings of the prior art are overcome and additional advantages are provided through the provision of a cooling apparatus. The cooling apparatus includes a supply manifold structure including a plurality of inlet orifices for injecting coolant onto a surface to be cooled when the cooling apparatus is employed to cool at least one electronic device; and a return manifold structure having a surface configured to seal to the surface to be cooled when the cooling apparatus is employed to cool the at least one electronic device. The return manifold structure is fabricated of a thermally conductive material, and provides at least one passageway for exhausting coolant after impinging on the surface to be cooled. When in use to cool the at least one electronic device with the surface of the return manifold structure sealed to the surface to be cooled, coolant exhausting through the at least one return passageway cools the return manifold structure, thereby facilitating further cooling of the surface to be cooled in a region where the surface of the return manifold structure seals to the surface to be cooled.

In enhanced aspects, the return manifold structure provides a plurality of return passageways for exhausting coolant after impinging on the surface to be cooled, and includes a plurality of thermally conductive fins. The plurality of return passageways are at least partially defined by the plurality of thermally conductive fins. In one embodiment, the plurality of thermally conductive passageways are disposed at a periphery of the supply manifold structure, and at least some return passageways of the plurality of return passageways have a characteristic dimension less than 250 micrometers. In another enhanced aspect, the plurality of inlet orifices include a plurality of jet orifices for providing jet impingement of coolant onto the surface to be cooled, and wherein when operational, coolant cools the plurality of thermally conductive fins when exhausting through the plurality of return passageways after impinging on the surface to be cooled.

In another aspect, a cooled electronic module is provided which includes a substrate, at least one electronic device to be cooled coupled to the substrate and a cooling apparatus for cooling the at least one electronic device. The cooling apparatus includes a supply manifold structure and a return manifold structure. The supply manifold structure includes a plurality of inlet orifices for injecting coolant onto at least one surface to be cooled. The at least one surface to be cooled is part of or is coupled to the at least one electronic device to facilitate transfer of heat from the at least one electronic device. The return manifold structure, which is fabricated of a thermally conductive material, includes a base surface sealed to the at least one surface to be cooled along a periphery thereof. The return manifold structure provides at least one return passageway for exhausting coolant after impinging on the at least one surface to be cooled, wherein coolant exhausting through the at least one passageway cools the return manifold structure, thereby facilitating further cooling of the surface to be cooled in a region where the base surface of the return manifold structure is sealed to the surface to be cooled.

In a further aspect, a method of fabricating a cooled electronic module is provided. This method includes: providing a substrate with at least one electronic device coupled to a surface of the substrate; providing a cooling apparatus for cooling the at least one electronic device, wherein providing the cooling apparatus includes: providing a supply manifold structure comprising a plurality of inlet orifices for injecting coolant onto at least one surface to be cooled, the at least one surface to be cooled comprising part of or being coupled to the at least one electronic device to facilitate transfer of heat from the at least one electronic device; and providing a return manifold structure having a base surface configured to seal to the at least one surface to be cooled along a periphery thereof, the return manifold structure comprising a thermally conductive material and providing at least one return passageway for exhausting coolant after impinging on the at least one surface to be cooled. The method further includes forming a thermally conductive, coolant-seal between the base surface of the return manifold structure and the at least one surface to be cooled along the periphery thereof, wherein when operational, coolant exhausting through the at least one return passageway cools the return manifold structure, thereby facilitating further cooling of the surface to be cooled in a region where the base surface of the return manifold structure is sealed to the at least one surface to be cooled.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Figure 1:
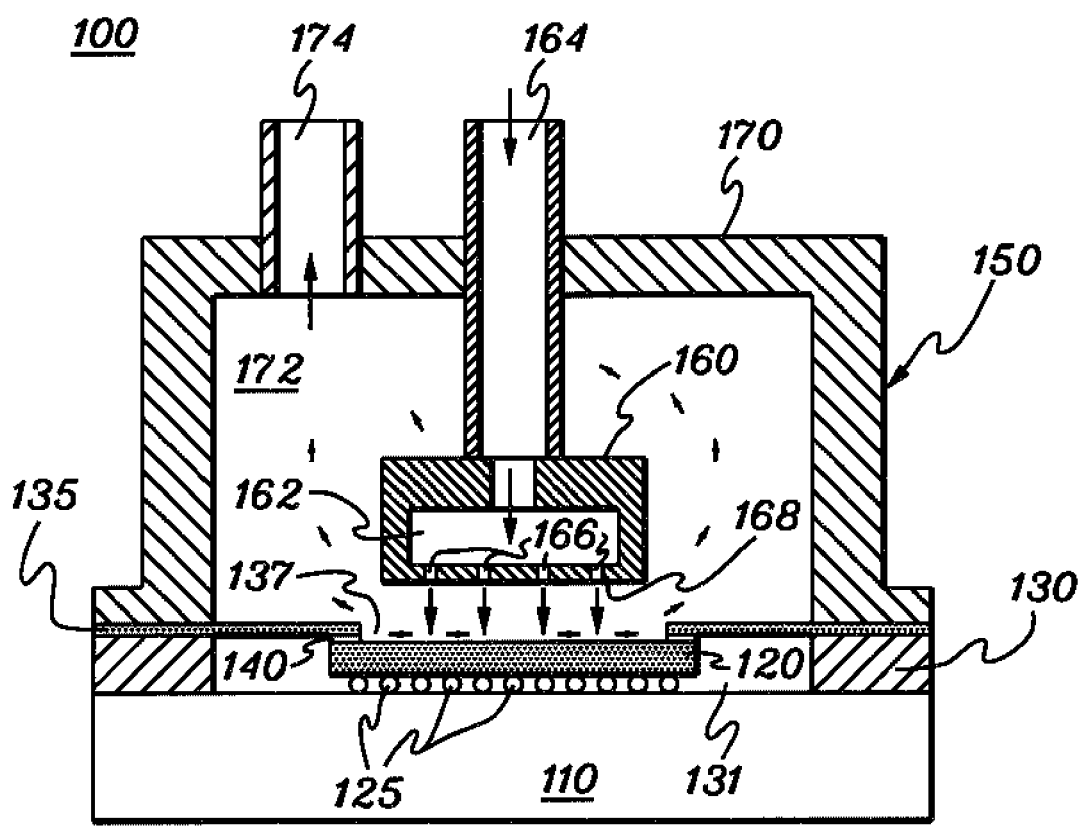
FIG. 1 is a cross-sectional elevational view of one embodiment of a cooled electronic module, in accordance with an aspect of the present invention.

As used herein "electronic device" comprises any heat generating electronic component of a computer system or other electronic system requiring cooling. In one example, the electronic device is or includes an integrated circuit chip, a semiconductor chip and/or an electronic component. The term "cooled electronic module" includes any electronic module with cooling and at least one electronic device, with single-chip modules and multi-chip modules being examples of a cooled electronic module as described herein. The "surface to be cooled" refers to a surface of the electronic device itself or to an exposed surface of a thermal cap, thermal spreader, passivation layer, or other surface in contact with the electronic device, and through which heat generated by the electronic device is to be extracted. As used herein, "micro-scaled" means a characteristic dimension of 250 micrometers (microns) or less.

Generally stated, provided herein are enhanced cooling apparatuses and methods of fabrication which allow for high heat transfer from a surface of an electronic device to be cooled using a direct (or indirect) liquid coolant impingement approach. In one embodiment, the cooling liquid may comprise a water-based, single-phase coolant. However, the concepts disclosed herein are readily adapted to use with other types of coolant, either two-phase or single-phase. For example, the coolant may comprise a brine, a fluorocarbon liquid, a liquid metal, or other similar coolant, or refrigerant, while still maintaining the advantages and unique features of the present invention.

As noted above, performance of computers continues to increase in both speed and function. Heat dissipated by electronic devices, and in particular, processor chips, is increasing correspondingly. Processor chips with an average heat flux of more than 100 W/cm$^2$ and a "hotspot" heat flux approaching 300 W/cm$^2$ are already being considered, and within the next few years these heat flux levels could approach 200 and 450 W/cm$^2$, respectively. The chip heat loads under consideration already exceed the capability of even the most effective air cooling apparatuses. Projected chip heat loads are likely even to exceed the capability of water cooling approaches with a cold plate attached at either the module or chip level.

One cooling solution which meets junction temperature requirements at these levels of heat flux is water cooling in direct contact with the back surface of the device or chip. This means that a mechanism is necessary to isolate: (1) any passive devices on the substrate (e.g., decoupling capacitors); (2) chip to substrate interconnections (e.g., "controlled collapsed chip connections" (C4) connections or wire bond connections); and (3) associated top surface metallurgy on the substrate. One cooling apparatus meeting these requirements is illustrated in FIG. 1, which depicts one embodiment of a cooled electronic module, generally denoted 100, in accordance with an aspect of the present invention.

In this embodiment, cooled electronic module 100 includes a substrate 110, which may include conductive wiring (not shown) on an upper surface thereof and/or embedded therein. An electronic device 120 is electrically connected to the wiring of substrate 110 via, for example, solder ball or C4 connections 125. A support structure 130, which in one embodiment could comprise a plate with a center opening, facilitates isolation of the active circuit portion of the electronic device 120, as well as the connections 125 and substrate surface metallurgy, from coolant within the module. A thin seal plate (or membrane) 135 separates the coolant or liquid space above the electronic device back surface from the dry volume 131 surrounding the front surface of the electronic device (i.e., the C4 interconnect region and the top surface of the substrate).

As shown in FIG. 1, a window 137 is provided in seal plate 135 to expose the back surface of electronic device 120 to be cooled. A sealant 140, such as an epoxy, provides a fluid-tight seal between seal plate 135 and electronic device 120. This hermetic seal is necessary if the coolant is aqueous in nature. A housing 150 is sealed to support structure 130 and includes a supply manifold structure 160 and a return manifold structure 170. Supply manifold structure 160 includes an inlet plenum 162, which receives coolant through at least one inlet opening 164 and directs coolant through a plurality of orifices 166, disposed in a jet orifice plate 168, onto the back surface of electronic device 120. In one embodiment, orifices 166 are jet orifices which provide an impinging jet flow onto the surface of the electronic device to be cooled. After impinging on the surface to be cooled, the coolant flows over the electronic device surface towards the periphery thereof, where it turns upwards and exits through an outlet manifold 172 via at least one outlet port 174.

Further details of seal plate 135 and the structure depicted in FIG. 1 are provided in the above-incorporated, co-pending application entitled "Fluidic Cooling Systems and Methods for Electronic Components." As shown in FIG. 1, window 137 provided in seal plate 135 is by necessity somewhat smaller than the outline of electronic device 120 in order to provide a band around the electronic device perimeter to which seal plate 135 is bonded employing sealing joint 140. One complication to the approach of FIG. 1 is that the device region on the front surface of electronic device 120 may extend beneath the overlap region where the seal membrane is bonded to the back of electronic device 120. Analysis results demonstrate that this overlap may adversely effect electronic device temperatures along the periphery of the device. The alternate embodiments depicted in FIGS. 2-4 address this complication. Additionally, another difficulty with the approach of FIG. 1 is a possible geometric interference with any decoupling capacitors mounted on the surface of the substrate. The height of a decoupling capacitor often extends above the height of the electronic device when disposed on the substrate. This issue is also addressed in the alternate cooling apparatus embodiments of FIGS. 2-4.

Figure 2:
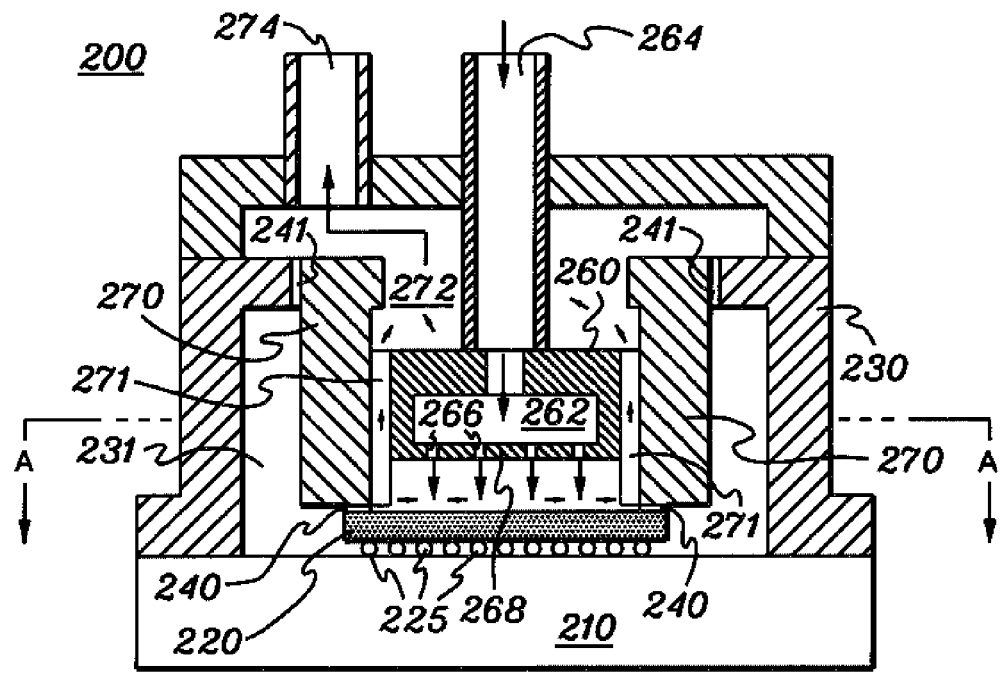
FIG. 2 is a cross-sectional elevational view of another embodiment of a cooled electronic module employing a thermally conductive return manifold structure afixed to the periphery of a surface to be cooled, in accordance with an aspect of the present invention.
Figure 3:
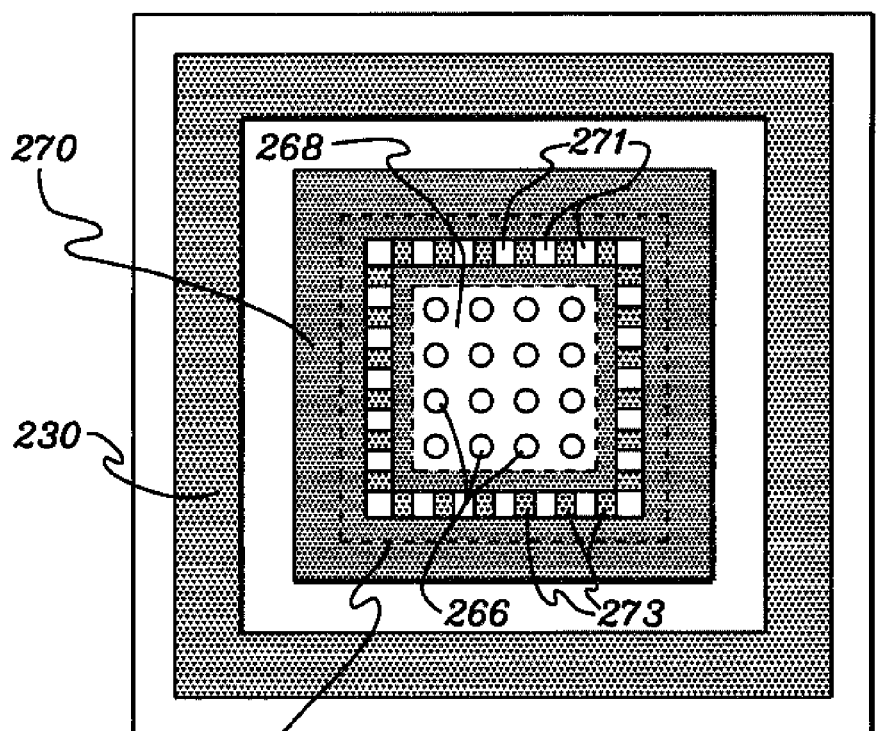
FIG. 3 is a cross-sectional plan view of the cooled electronic module embodiment of FIG. 2, taken along line A-A, in accordance with an aspect of the present invention.
Figure 4:
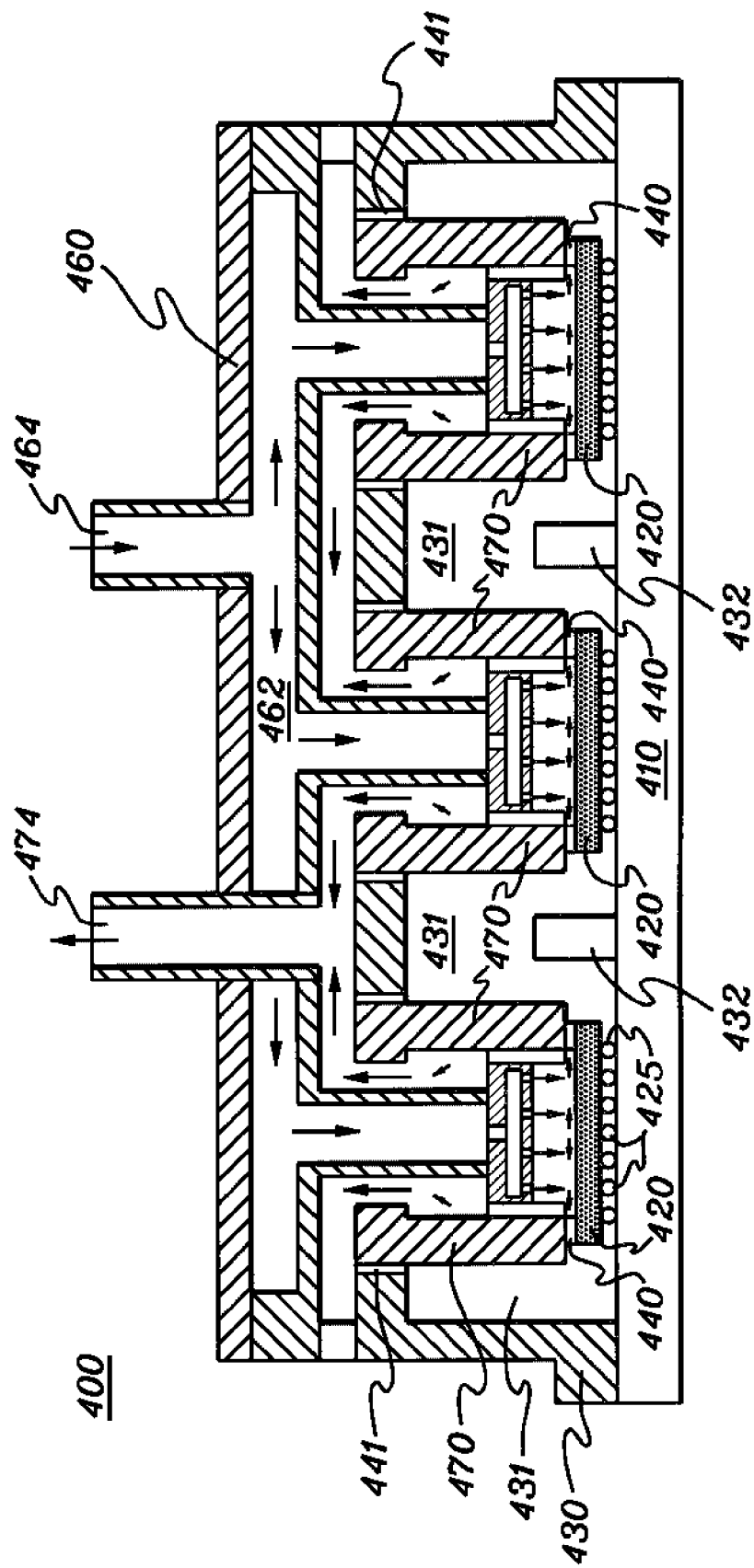
FIG. 4 is a cross-sectional elevational view of another embodiment of a cooled electronic module wherein multiple electronic devices are cooled employing one or more thermally conductive return manifold structures afixed to the periphery of each surface to be cooled, in accordance with an aspect of the present invention.

Generally stated, the module embodiments of FIGS. 2-4 employ a cooling apparatus, which again includes a coolant supply manifold structure and a coolant return manifold structure. The supply manifold structure is similar to the supply manifold structure described above in connection with FIG. 1, while the return manifold structure is fabricated to be thermally conductive and is modified to bond (employing a thermally conductive bond) directly to the surface to be cooled, e.g., the back surface of the one or more electronic devices, and also be bonded to a cap structure. In this approach, the return manifold structure segregates liquid coolant impinging on the back surface of the electronic device(s) from the front surface(s) of the electronic device(s) and the upper surface of the substrate. Further, the return manifold structure provides an effective cooling path from the region of the electronic device surface bonded to the base surface thereof to exhausted coolant passing through a plurality of return passageways defined in part by a plurality of thermally conductive fins extending inwardly from the return manifold structure. Because of the effective cooling path(s) established through the return manifold structure, this cooling apparatus avoids the problem of high temperatures along the periphery of the electronic device using a cooling approach such as depicted in FIG. 1, and in fact, cools the periphery of the device to an even greater extent than the middle of the device.

FIG. 2 is a cross-sectional elevational view of one embodiment of a cooled electronic module 200 accommodating a single electronic device, such as an integrated circuit chip. FIG. 3 is a cross-sectional plan view of the cooled electronic module 200 of FIG. 2, taken along line A-A. In the embodiment of FIGS. 2 & 3, cooled electronic module 200 again includes a substrate 210, which may include conductive wiring (not shown) on an upper surface thereof and/or embedded therein, and an electronic device 220 electrically connected to the wiring of substrate 210 via, for example, solder ball or C4 connections 225. A capping structure 230 seals (e.g., by soldering) to the upper surface of substrate 210 to facilitate isolation of the active circuit portion of electronic device 220, as well as connections 225 and any substrate 210 surface metallurgy within a dry volume 231.

The cooling apparatus includes a supply manifold structure 260 and a return manifold structure 270 for supplying and exhausting coolant respectively. Supply manifold structure 260 is analogous to structure 160 of the module embodiment of FIG. 1. In particular, supply manifold structure 260 includes an inlet plenum 262, which receives coolant through at least one inlet opening 264 and directs coolant through a plurality of orifices 266, disposed in an orifice plate 268, onto a surface of electronic device 220. In one embodiment, orifices 266 comprise jet orifices which provide an impinging jet flow onto the surface of the electronic device to be cooled. After impinging on the surface to be cooled, coolant flows over the electronic device surface towards the periphery thereof, where it turns upwards and ultimately exits through an outlet manifold 272 via at least one outlet port 274.

In this embodiment, return manifold structure 270 is a thermally conductive material, such as a metal (e.g., copper or aluminum), diamond, silicon, SiC, or AlN, and is sealed to the periphery of electronic device 220 using, for example, a solder band (which is a good thermal conductor) around the perimeter of the electronic device 220. Alternatively, structure 270 could be sealed to the periphery of electronics device 220 using a thermally conductive epoxy, silicon gel or amalgam. Return manifold structure 270 includes a plurality of thermally conductive fins 273 (FIG. 3) projecting from an inner surface thereof surrounding the periphery of supply manifold structure 260. This plurality of thermally conductive fins 273 defines a plurality of return passageways 271 through which exhausted coolant passes after impinging upon the surface to be cooled. As shown in FIG. 3, the alternating fins and passageway are each rectangular shaped (in one example). Since the base surface of the return manifold structure is soldered to the perimeter of the electronic device, a good thermal conduction path is established from the electronic device in the peripheral region thereof through the solder joint 240 to the thermally conductive return manifold structure 270 in the region of the plurality of thermally conductive fins 273, which as noted, partially define the plurality of return passageways 271 through which exhausted coolant flows. Thus, heat from the bonded or soldered region between the base surface of the return manifold structure in the periphery of the electronic device is further rejected to coolant flowing through these return passageways via the plurality of thermally conductive fins. In one embodiment, the plurality of return passageways are micro-scaled, as are the plurality of thermally conductive fins. Note that by providing the good thermal conduction paths to the exhausted coolant, the coolant-tight seal region of the electronic device is effectively actively also cooled.

FIG. 4 depicts an alternate embodiment of a cooled electronic module 400 in accordance with an aspect of the present invention. This cooled electronic module includes multiple electronic devices, and is in one example a multi-chip module. Unless otherwise stated below, the structures and materials described above in connection with FIGS. 2 & 3 apply to cooled electronic module 400 as well. A substrate 410 supports multiple electronic devices 420, which are electrically connected to wiring (not shown) on an upper surface thereof and/or embedded therein via, for example, solder ball connections 425. A capping structure 430 seals to substrate 410 as well as to the return manifold structure 470, via for example, solder 441. In an alternate embodiment, the capping structure and return manifold structure could be integrally formed. A base surface of the return manifold structure 470 is soldered 440, for example, to each electronic device 420, along the periphery thereof, to form a thermally conductive, coolant-tight seal at the periphery at each surface to be cooled. Coolant, introduced through coolant inlet 464 to a supply manifold 462 defined by supply manifold structure 460 passes through a plurality of inlet orifices and is injected onto the surface to be cooled, as described above. After impinging on the surface to be cooled, the coolant flows over the electronic device surface towards the periphery thereof, where it turns upwards and exits through the plurality of return passageways defined by the plurality of thermally conductive fins projecting inwardly from the return manifold structure around the periphery of the supply manifold structure in the region of the inlet manifold and orifices. As with the embodiment of FIGS. 2 & 3, the good thermal conduction paths through the return manifold structure in the vicinity of the coolant-tight seals result in active cooling of the electronic devices in the peripheral regions thereof.

As shown in FIG. 4, a dry volume 431 is defined between different portions of the return manifold structure, as well as between the return manifold structure and the capping structure. This dry volume 431 is sized to accommodate multiple passive devices, such as decoupling capacitors 432 extending a height greater than the height of the electronic devices above the surface of the substrate 410. Other passive devices may also be present on the substrate, such as resistors, other capacitors or inductors. Further, these passive devices could be between capping structure 430 and return manifold structure 470, or between different electronic devices, as shown with decoupling capacitors 432 in FIG. 4.

Thermal analysis of a 15 mm×15 mm, high performance processor chip incorporating a cooling apparatus in accordance with aspects of the present invention has been performed. Results of this analysis show significantly lower temperatures in the periphery of the processor chip where an actively cooled return manifold structure, configured as described herein, is soldered to the processor chip.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims.

What is claimed is:

1. A method of fabricating a cooled electronic module comprising:

providing a substrate with at least one electronic device coupled to a surface of the substrate;

providing a cooling apparatus for cooling the at least one electronic device, wherein providing the cooling apparatus comprises:

providing a supply manifold structure comprising a plurality of inlet orifices for injecting coolant onto at least one surface to be cooled, the at least one surface to be cooled comprising part of or being coupled to the at least one electronic device to facilitate transfer of heat from the at least one electronic device;

providing a return manifold structure having a base surface configured to seal to the at least one surface to be cooled along a periphery thereof, the return manifold structure comprising a thermally conductive material and comprising a plurality of fins projecting from at least one inner surface thereof at the periphery of the supply manifold structure, the plurality of fins in part defining a plurality of return channels disposed over the periphery of the surface to be cooled for exhausting coolant at the periphery of the surface to be cooled after impinging on the at least one surface to be cooled;

forming a thermally conductive, coolant-tight seal between the base surface of the return manifold structure and the at least one surface to be cooled along the periphery thereof, wherein when operational, coolant exhausting through the plurality of return channels cools the return manifold structure, thereby facilitating further cooling of the surface to be cooled in a region where the base surface of the return manifold structure is sealed to the at least one surface to be cooled;

wherein the plurality of return channels are uniformly spaced about the periphery of the surface to be cooled, and are defined by the plurality of fins projecting from the at least one inner surface of the return manifold structure being uniformly spaced; and wherein providing the cooling apparatus further comprises providing a capping structure at least partially surrounding the return manifold structure and at least partially spaced from the return manifold structure to define in part a dry volume between the capping structure and the return manifold structure isolated from coolant, the capping structure being sealed to the substrate, wherein the dry volume accommodates at least one passive device disposed adjacent to the at least one electronic device on the substrate, the at least one passive device extending a height above the substrate greater than a height of the at least one electronic device above the substrate.

2. The method of claim 1 wherein forming the thermally conductive, coolant-tight seal between the base surface of the return manifold structure and the at least one surface to be cooled comprises soldering the base surface of the return manifold structure to the at least one surface to be cooled along the periphery thereof.

* * * * *